United States Patent
Lee

(10) Patent No.: US 6,956,640 B2
(45) Date of Patent: Oct. 18, 2005

(54) LIGHT ENERGY DETECTING APPARATUS FOR EXPOSURE CONDITION CONTROL IN SEMICONDUCTOR MANUFACTURING APPARATUS

(75) Inventor: Byeong-Cheol Lee, Whasung-gun (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 41 days.

(21) Appl. No.: 10/655,309

(22) Filed: Sep. 5, 2003

(65) Prior Publication Data

US 2004/0057035 A1 Mar. 25, 2004

(30) Foreign Application Priority Data

Sep. 19, 2002 (KR) ........................................ 2002-57145

(51) Int. Cl.[7] .............................................. G03B 27/42
(52) U.S. Cl. .............................. 355/53; 355/55; 355/67; 355/68; 355/69; 250/205; 250/548; 356/400; 356/401
(58) Field of Search ............................... 355/53, 67–69, 355/71, 55, 70; 250/548, 205; 356/399–401

(56) References Cited

U.S. PATENT DOCUMENTS

| | | | | | |
|---|---|---|---|---|---|
| 5,475,491 A | * | 12/1995 | Shiozawa | .................... | 355/68 |
| 5,767,950 A | * | 6/1998 | Hawver et al. | ............... | 355/71 |
| 5,898,477 A | * | 4/1999 | Yoshimura et al. | ........... | 355/53 |
| 6,744,492 B2 | * | 6/2004 | Takahashi et al. | ............ | 355/69 |

* cited by examiner

*Primary Examiner*—D. Rutledge
(74) *Attorney, Agent, or Firm*—Volentine Francos & Whitt, PLLC

(57) ABSTRACT

A light energy inspecting apparatus provides an optimum exposure condition in photolithographic apparatus by sensing the energy levels of light passing through the aperture of a diaphragm. The light energy inspecting apparatus includes a photoelectric transformation unit, a drive mechanism for the photoelectric transformation unit, and a controller. The photoelectric transformation unit is made up of a plurality of photoelectric transformation devices (PTDs) which can each sense the level of energy of incident light and convert the incident light to a corresponding electric signal. The drive mechanism positions the photoelectric transformation unit relative to the diaphragm.

19 Claims, 10 Drawing Sheets

LIGHT ENERGY DETECTING APPARATUS FOR EXPOSURE CONDITION CONTROL IN SEMICONDUCTOR MANUFACTURING APPARATUS

BACKGROUND OF THE INVENTION

1. Field of the Invention

The present invention relates to the fabrication of semiconductor devices. More particularly, the present invention relates to a method of and apparatus for determining optimum exposure conditions in a photolithographic process.

2. Description of the Related Art

The manufacturing of electronic devices such as semiconductor devices or liquid crystal displays typically includes a photolithography process. Photolithography generally involves exposing a photosensitive film, disposed on a semiconductor or glass substrate, to light directed through a photo mask or a reticle (hereinafter, referred to as a 'reticle') to transfer an image of the reticle to the film. The photosensitive film is then developed to produce a pattern for use as a mask during the subsequent processing of the substrate. In such a photolithography process, the exposure light must have energy capable of chemically changing the photosensitive film such that an exact focused image, i.e., an image having the desired pattern, will be transferred to the photosensitive film.

In a conventional technique to determine a correlation between the focus and the light energy, at least one condition of a mock photolithography process is continuously changed so that different regions of a photosensitive film (shots) are sequentially exposed under varying conditions. For instance, a condition related to the focusing of the image and/or the exposure amount (time during which a shutter is held open) is changed for each shot, thereby forming corresponding pattern images at the different shots. Then, respective mask patterns are produced by developing the photosensitive film. The dimensions of the mask patterns thus produced are measured using an optical microscope or a scanning electron microscope (SEM) to ascertain the best mask pattern. The optimum exposure condition is determined from the best mask pattern as a correlation between the focus and the exposure amount.

However, measuring the developed mask patterns using a SEM requires a great amount of time. Furthermore, the work is repetitive, must be constantly checked for accuracy, and corrections must be made throughout the course of the measuring processes. Still further, an actual pattern for use as a mask on a substrate is more complicated, in terms of the various shapes and line widths thereof, than the pattern used in the mock photolithographic process. Thus, the conventional measurement technique also must rely on statistical analysis to determine the optimum exposure conditions for the actual photolithography process.

SUMMARY OF THE INVENTION

Accordingly, objects of the present invention include reducing the amount of time required for performing an exposure step in a photolithographic process, making it easier to establish an optimum exposure condition for the process, and enhancing the result of obtaining the exposure condition under which the process is to be carried out.

To these ends, the present invention provides an illumination system having a light energy inspecting apparatus for sensing the energy level of light that is actually passed through the aperture of the diaphragm of the system. Likewise, the present invention provides a method of establishing an optimum exposure condition in the illumination system on the basis of the energy level of light that is actually passed through the aperture of the diaphragm of the system. Still further, the present invention provides a method of exposing a photosensitive film under an optimum exposure condition obtained on the basis of the energy level of light that is actually passed through the aperture of the diaphragm of the system.

According to one aspect of the present invention, a light energy inspecting apparatus includes a photoelectric transformation unit, a drive mechanism for the photoelectric transformation unit, and a controller.

The photoelectric transformation unit has a plurality of photoelectric transformation devices (PTDs). Each of the PTDs is capable of sensing the energy level of light incident thereon and of converting the energy level to a corresponding signal. The photoelectric transformation unit is operative to output signals indicative of the locations and energy levels of respective portions of light incident on the photoelectric transformation devices.

The drive mechanism is connected to and supports the photoelectric transformation unit. The drive mechanism is controllable to move the photoelectric transformation unit between first and second positions. In the first position, the photoelectric transformation devices are juxtaposed with the aperture of a diaphragm of the system. In the second position, the photoelectric transformation devices are offset from the aperture with respect to the optical axis of the illumination system.

The controller is operatively connected to the photoelectric transformation unit and to the diaphragm so as to receive the signals output by the photoelectric transformation unit and set the size of the aperture of the diaphragm based on the signals.

According to another aspect of the present invention, an exposure condition control system having the light energy inspecting apparatus of illumination light comprises a photoelectric transformation part, in which a plurality of photoelectric transformation devices (PTD) are equipped to be face to face with an illumination direction of the illumination light, the photoelectric transformation part being for sensing light energy per respective portion of an illumination light pass region in a diaphragm; a drive for positioning the photoelectric transformation part to correspond to the diaphragm in response to a control signal; a control unit for controlling an opening/closing of the diaphragm in response to a control signal; and a controller for controlling the drive, receiving a sense signal from the photoelectric transformation part to decide a light energy condition for a photosensitive film, and obtaining a determination value for an opening/closing level of the diaphragm, to thus control the opening/closing level of the diaphragm through the control unit.

According to still another aspect of the present invention, a method of establishing an exposure condition is applied to an illumination system comprising a light source that emits light, optics that project the light along an optical axis, a reticle disposed along the optical axis and having a pattern that diffracts the light, whereby respective orders of the diffracted light undergo constructive interference, and a diaphragm disposed downstream of the reticle with respect to the optical axis. The diaphragm is an optical diaphragm having an adjustable aperture disposed along the optical axis. Accordingly, orders of the diffracted light pass through the aperture in amounts corresponding to the diameter of the opening of the aperture.

First, the levels of energy of respective portions of the diffracted light are sensed at a location adjacent the diaphragm. Information is produced correlating the energy levels to the locations of where the portions of light have/would pass through the aperture of the diaphragm, i.e., light energy positional information is produced.

Next, the energy level of light produced as the result of the constructive interference of the light passing through the aperture of the diaphragm is calculated on the basis of the positional information.

This calculation is used to determine a standard size for the aperture of the diaphragm, namely the diameter of the aperture that will facilitate a desired focus condition of the diffracted light which passes through the aperture of the diaphragm. Finally, the diaphragm is adjusted (opened or closed) until the diameter of the aperture of the diaphragm is of the standard size.

According to another aspect of the present invention, the desired focus condition is used an exposure process. To this end, a substrate covered with a photosensitive film is aligned with the diaphragm after the diaphragm has been adjusted so that the diameter of the aperture thereof is of the standard size. Then, the photosensitive film is exposed to light from the illumination system passed via the aperture.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE PREFERRED EMBODIMENTS

Hereinafter, preferred embodiments of the present invention will be described in detail with reference to FIGS. 1 through 15.

Figure 1:
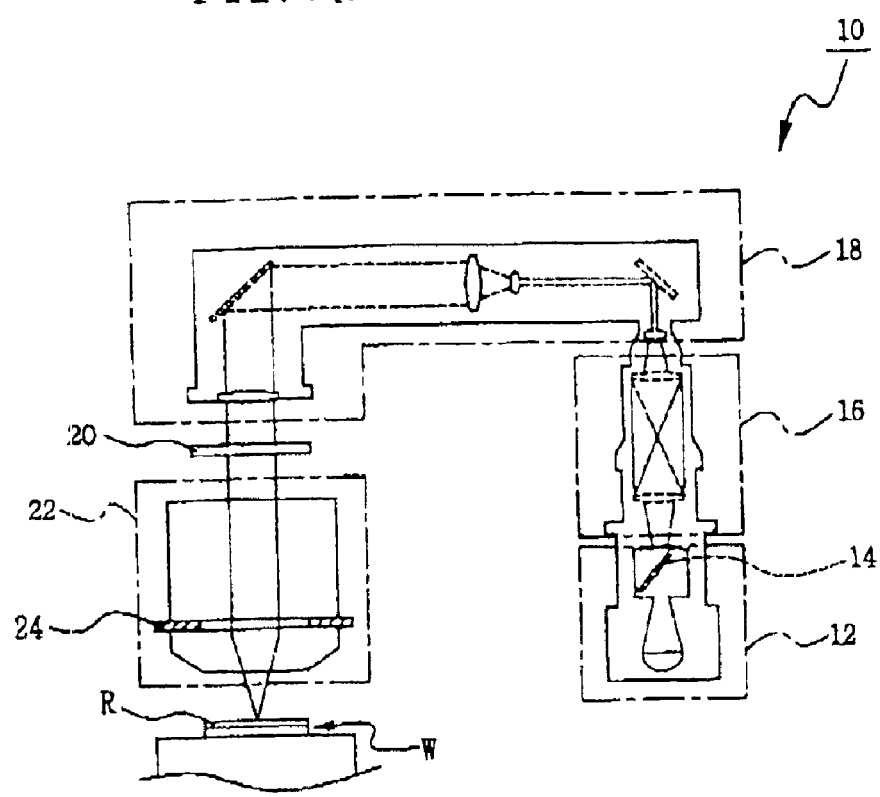
FIG. 1 is a schematic sectional view of a typical illumination system of photolithographic apparatus.

However, before a description of the present invention proceeds, a photolithography process will be described in general with reference to FIG. 1. The photolithographic apparatus shown in FIG. 1, and to which the present invention may be applied, includes an illumination system 10 having a lamp unit 12, a light source unit 16, illumination optics 18, a reticle 20, projection optics 22, and a diaphragm 24 connected to each other in the foregoing sequence along an optical path.

The lamp unit 12 includes a lamp for emitting light in one direction along the optical path, and a shutter 14 for selectively blocking the light and allowing the light to propagate along the optical path in response to applied control signals. The light source unit 16 filters the light emitted by the lamp unit 12 so that only light of a particular wavelength may be pass therethrough, or shapes the light propagating therethrough. That is, the light source unit 16 can produce light having various shapes, including the shapes shown in FIG. 2, which will be described in more detail later on.

Figure 3:
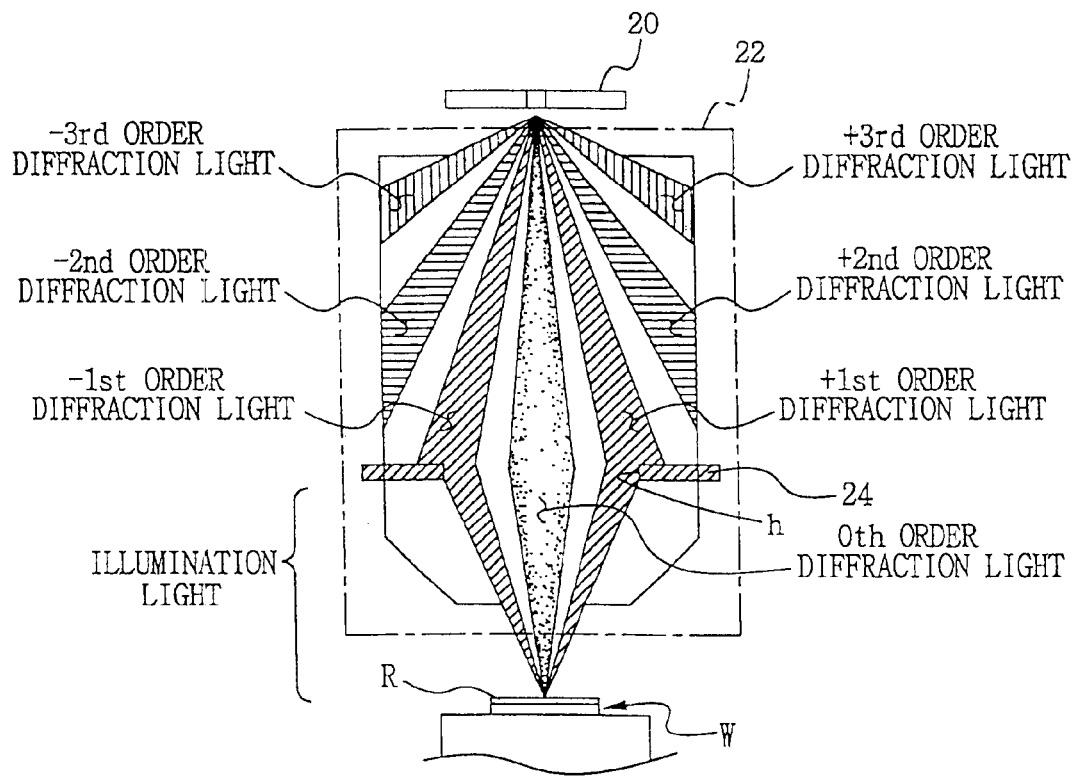
FIG. 3 is a sectional view of a reticle and a diaphragm of the illumination system, showing a distribution of respective orders of illumination passed and scattered therethrough.

The light passing through the light source unit 16 enters the illumination optics 18 whereupon the light is refracted or reflected within a given area towards a reticle 20. The light then passes through a pattern image of the reticle 20, whereby the light is diffracted as shown in FIG. 3. The respective orders of the diffracted light are directed towards individual regions of a diaphragm 24 by a plurality of lenses of the projection optics 22 disposed face-to-face with and downstream of the reticle 20. More specifically, the respective orders of the diffracted light are directed through an aperture (h) of the diaphragm 24 along mutually different angles by the projection optics 22 and thus, undergo interference. Accordingly, the respective orders of the diffracted light are recombined on, namely, irradiate, the photosensitive film (R) of a substrate (W) so as to expose the film (R) to the pattern image defined by the reticle.

All orders of the light passing through the reticle 20 must be focused to the same extent to reduce the pattern image of the reticle 20 and reproduce it intact on the photosensitive film (R). However, the higher orders of the diffracted light, namely those propagating at a great angle with respect to the optical axis of the projection optics 22, do not reach the photosensitive film (R) as shown in FIG. 3.

Also, it is difficult to control the diffracted light such that the higher orders of the diffracted light recombine at the desired focus. This difficulty poses limitations on the ability of the process to facilitate an exact exposure of the photosensitive film (R) with the pattern image of the reticle. In particular, the pattern image must have a fine line width to meet the demand for devices having high densities. The finer the line width of the pattern image, the larger the angles of diffraction of the respective orders of the light become. That is, constructive interference makes it difficult to recombine these respective orders of the diffraction light at the same focus. Therefore, in the present technology, only the 0th order and the ±1st order of the diffracted light pass through the diaphragm 24 in the direction of the optical path and reach the photosensitive film (R).

Figure 4:
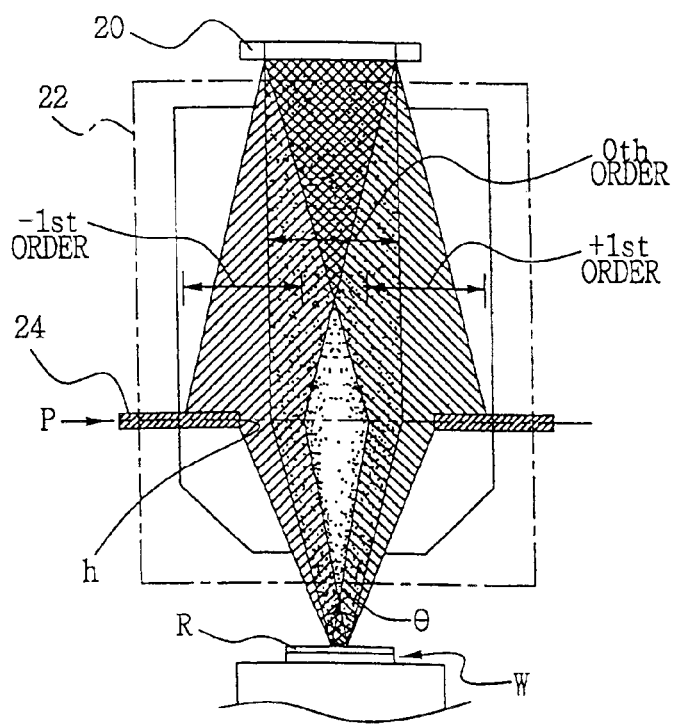
FIG. 4 is a similar view but with another reticle configured to produce 0th and 1st orders of diffracted light.
Figure 5:
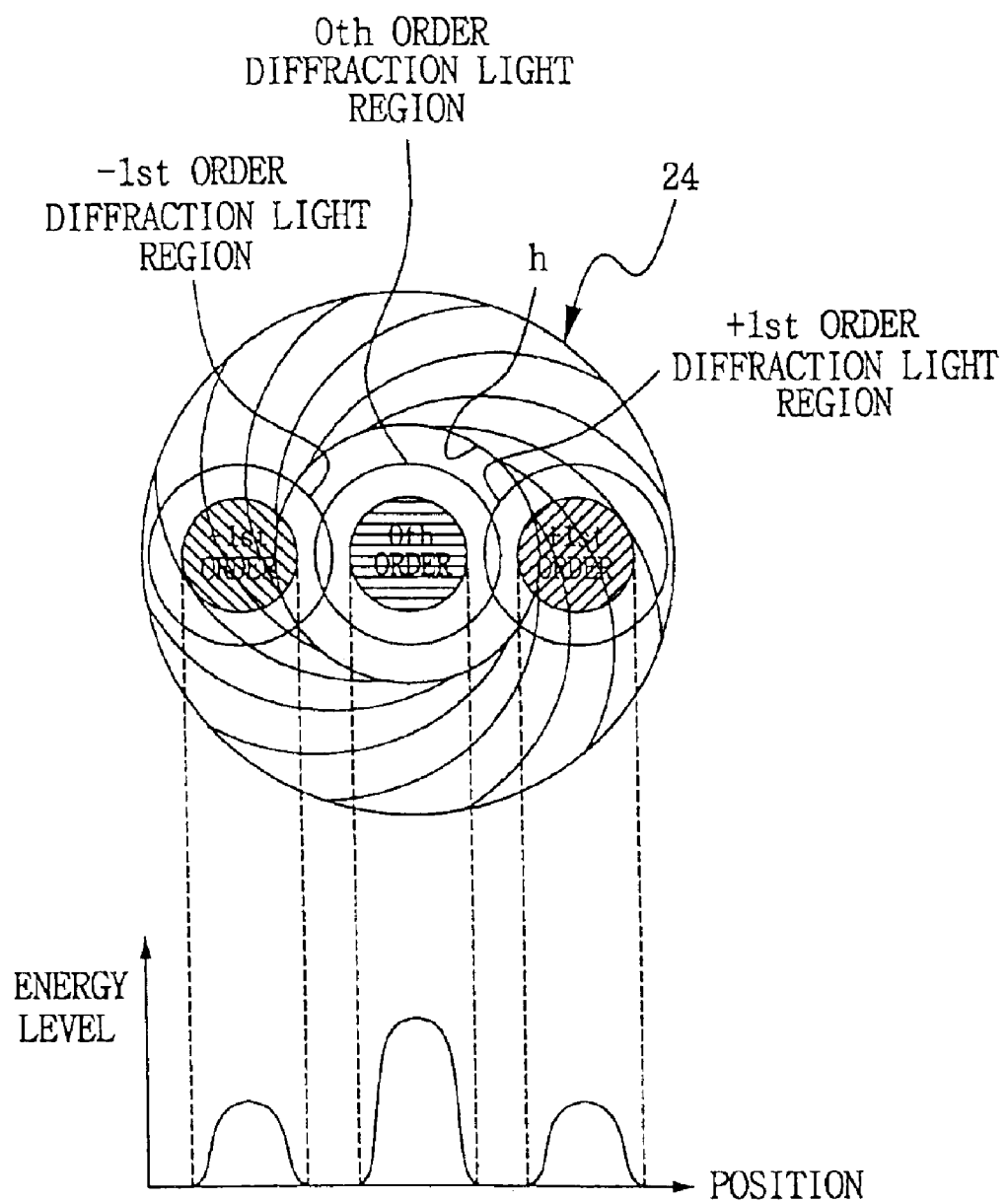
FIG. 5 is a plan view showing the regions of the diaphragm impinged by the respective orders of the diffracted light shown in FIG. 4.

Meanwhile, the 0th order and ±1st order of the diffracted light illuminate discrete regions of the diaphragm 24 at position P, as shown in FIGS. 4 and 5. At this time, the 0th order passes through the aperture (h) of the diaphragm 24. However, the amount of the ±1st order of the diffracted light that passes through the diaphragm 24 is limited by the extent to which the diaphragm 24 is opened/closed. The amount of the ±1st order of the diffracted light that passes through the diaphragm 24 influences the resolution of the exposure process.

Figure 6A:
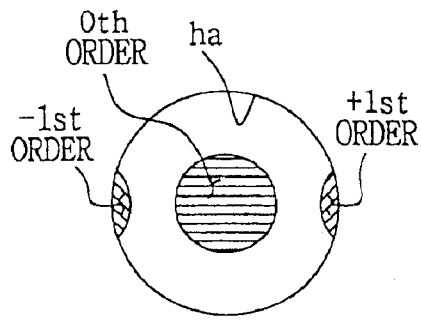
FIGS. 6a through 6c are plan views of apertures of different sizes of the diaphragm, respectively, each illustrating a corresponding amount of light that is allowed to pass therethrough.
Figure 6B:
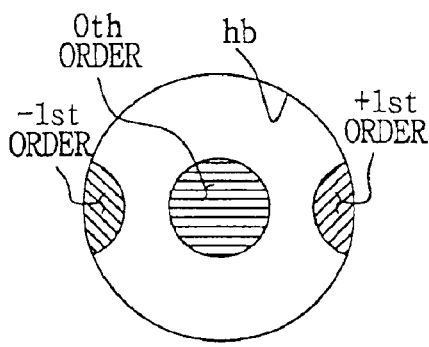
Figure 6C:
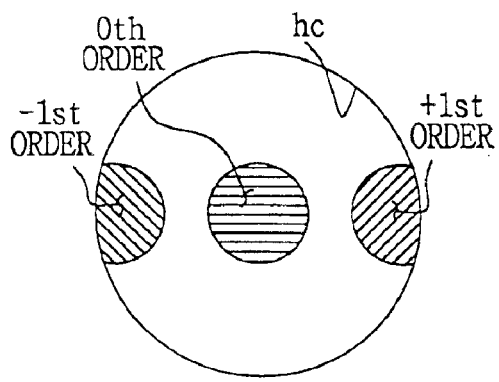
Figure 7A:
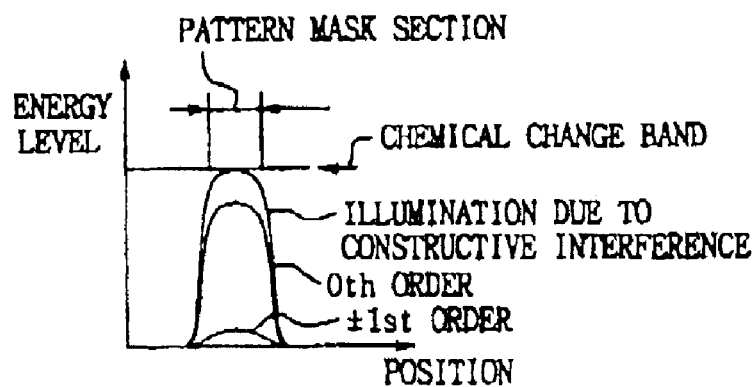
FIGS. 7a through 7c are graphs of light energy levels, corresponding to FIGS. 6a through 6c, respectively, upon the constructive interference of the respective orders of light.
Figure 7B:
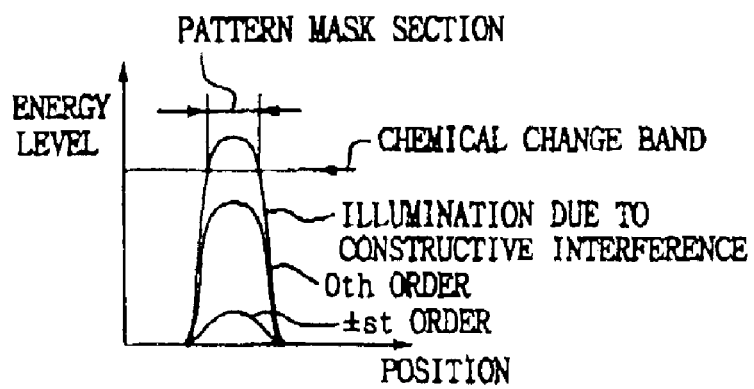
Figure 7C:
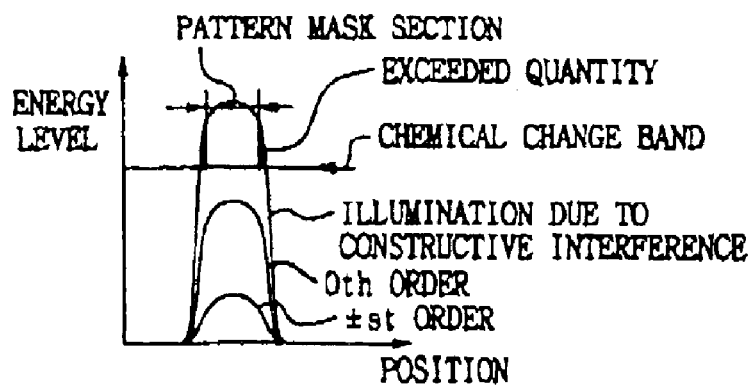
Figure 8A:
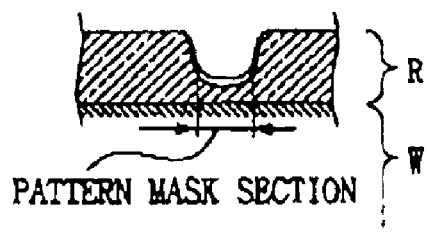
FIGS. 8a through 8c are sectional views of a photosensitive film, showing the patterning thereof after being exposed to light having the energy levels depicted in the graphs of FIGS. 7a through 7c, respectively.
Figure 8B:
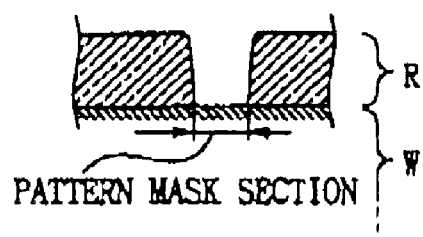
Figure 8C:
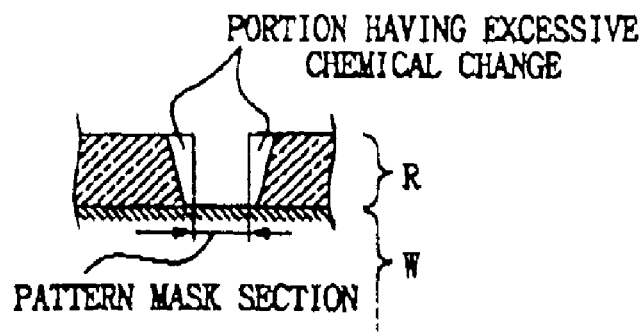

That is, for any particular line width of a pattern image of the reticle 20, the amount of light that irradiates the photosensitive film (R) depends on the size (ha, hb, hc) of the aperture as shown in FIGS. 6a through 6c. The graphs of FIGS. 7a through 7c show the corresponding intensity profiles of the diffracted light, namely, the energy level of the diffracted light due to constructive interference at the focal position on the photosensitive film (R). The corresponding chemical changes of photosensitive films (R), as well as the ultimate shape of the sidewalls of the mask patterns formed when the films are developed, are shown in FIGS. 8a through 8c, respectively.

As can be appreciated from these figures, the exposure time and energy level of the photosensitive film (R), obtained through the constructive interference of the respective 0th and ±1st orders of the diffracted light, determine the shape of the sidewalls of the mask pattern formed when the photosensitive film (R) is developed. Furthermore, the larger the angle of the ±1st order of the diffracted light reaching the photosensitive film (R) is, the smaller the depth of focus becomes. Additionally, the contrast of the image transferred to the photosensitive film (R) increases as the amount of the ±1st order of diffracted light, allowed to pass through the aperture h of the diaphragm 24, increases. Accordingly, a mask pattern having a fine line width can be formed according to the conditions shown in FIGS. 6b, 7b and 8b. However, a focus defect occurs if too much of the ±1st order of diffracted light is allowed to pass through the aperture h of the diaphragm 24 (when the size of the aperture is hc as shown in FIGS. 6c, 7c and 8c). In this case, the depth of focus is small, whereupon the upper portion of the photosensitive film (R) is exposed over a relatively wide region and the sidewall of the resultant mask pattern has a large incline. Thus, the relationship between the resolution, NA, depth of focus and wavelength of the light can be expressed as: Resolution=$k1 \times \lambda / NA$, and Depth of Focus=$k2 \times \lambda / NA2$. Again, therefore, it is shown that the aperture size (h) of the diaphragm 24 is a considerable influence on the resolution and the focus of the exposure process.

Moreover, the image of light coming out of a reticle having a contact hole pattern is very different from that coming out of a reticle having a line/space pattern. Optically speaking, a contact hole pattern may be compared to a single slit, whereas a line/space pattern may be compared to a grating. The light pattern coming from a single slit is a continuous spectrum. Theoretically, an entire spectrum must be allowed through the projection optics to produce an image of a perfect contact hole on the photosensitive film. However, this is impossible due to the finite and limited size of the projection optics. In any case, though, the greater the size (h) of the aperture of the diaphragm 24, the more exact the image of the contact hole becomes on the photosensitive film (R). The depth of focus, on the other hand, is not so important for producing an image of a contact hole on the photosensitive film (R).

The conventional photolithography process involves opening the diaphragm 24 based on statistical data obtained through tests simulating the light shape produced by the light source unit 16, the exposure time allowed by the shutter 14, and the focus conditions. As was mentioned earlier, this process requires a great deal of time. Also, an exact simulation of the exposure conditions is difficult to obtain using the conventional technique. Furthermore, the conventional technique is not reliable for determining the exposure conditions for a pattern image of a reticle having a complicated shape, i.e., a combination of lines and spaces of various widths.

Figure 9:
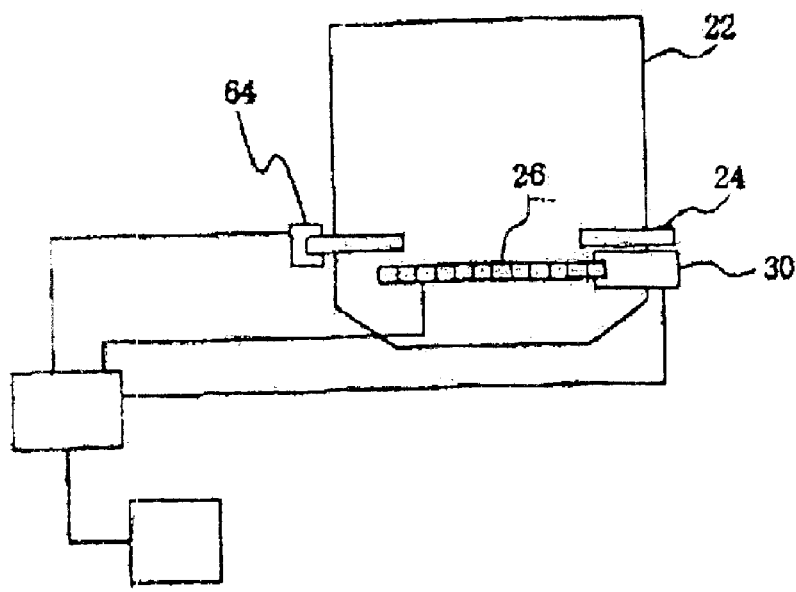
FIG. 9 is a schematic diagram of essential elements of an illumination system having a light energy inspecting apparatus in accordance with the present invention.

The present invention overcomes these limitations by providing, as shown in FIG. 9, a light energy inspecting apparatus for sensing the energy of respective portions of the light that pass through the aperture (h) of the diaphragm 24. The light energy inspecting apparatus includes a photoelectric transformation unit 26 comprising a plurality of photoelectric transformation devices (PTDs) disposed in the optical path and which devices can sense the energy of the light incident thereon. The photoelectric transformation unit 26 is also operative to generate signals indicative of these energies and relative positional information thereof, and to send such signals to a controller 28 via a connector such as a cable. Photosensitive elements, i.e., the PTDs, that are capable of quantifying the energy (magnitude) of light incident thereon are known per se and therefore, a further description thereof will be omitted.

The light energy inspecting apparatus also includes a drive mechanism 30 for moving the photoelectric transformation unit 26 between a first position at which the photoelectric transformation unit 26 is disposed face-to-face with the diaphragm 24 and a second position at which the photoelectric transformation unit 26 is remote from the diaphragm 24. The first position may be one at which the photoelectric transformation unit 26 is disposed at the front of the diaphragm 24 as shown in either of the embodiments of FIGS. 10 and 11, or to the rear of the diaphragm 24 as shown in FIG. 9. The drive mechanism 30 operates in response to a control signal from the controller 28.

Figure 10:
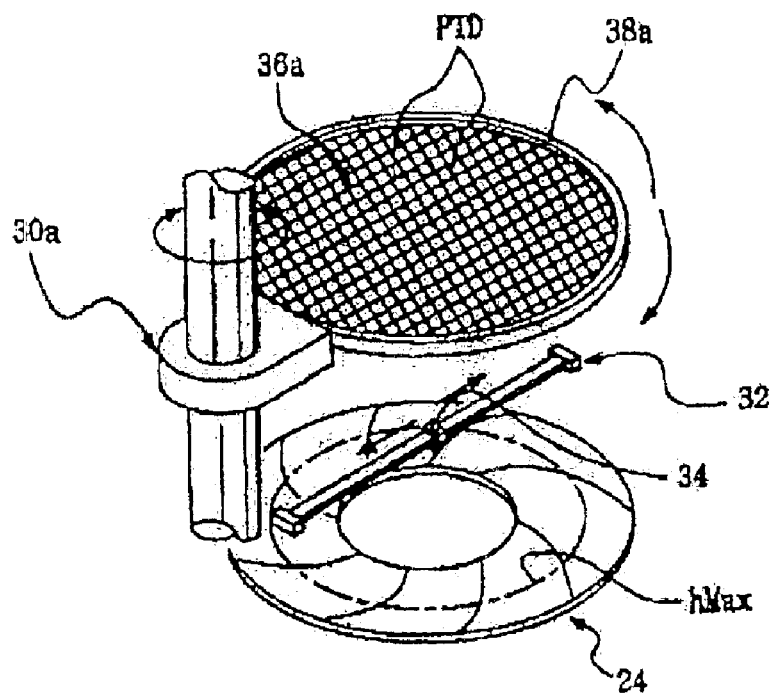
FIG. 10 is a perspective view of a first embodiment of the light energy inspecting apparatus in accordance with the present invention.
Figure 11:
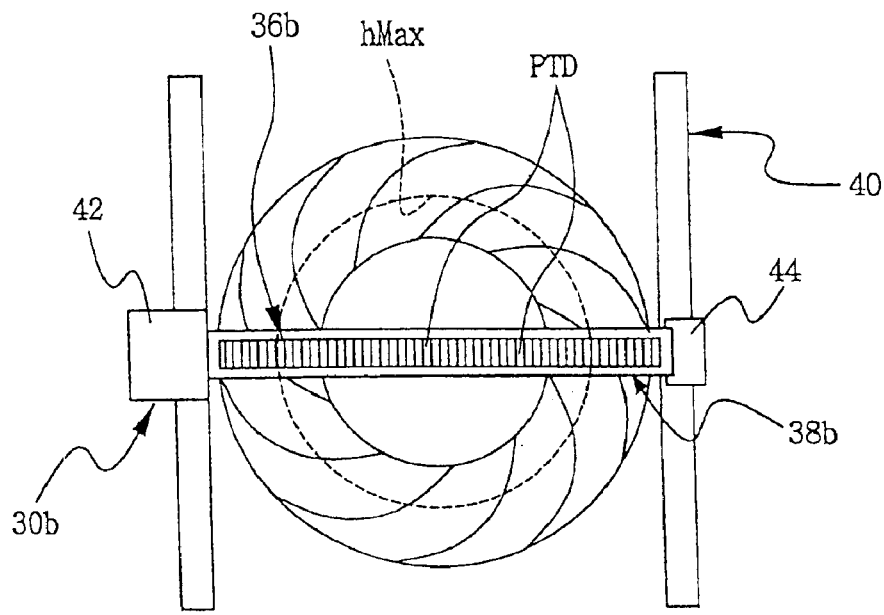
FIG. 11 is a plan view of another embodiment of the light energy inspecting apparatus in accordance with the present invention.

As shown in the embodiment of FIG. 10 or 11, the PTDs of the photoelectric transformation unit 26, through which the exposure light will pass, are arrayed in at least one direction over a distance larger than the maximum opening (hMax) of the diaphragm 24. Also, as shown in FIG 10, an opening/closing sensor 32 may be provided to sense the degree to which the diaphragm 24 is open/closed and to issue a signal indicative of this information to the controller 28. A PTD arranging sensor 34 may also be provided for sensing the presence of the photoelectric transformation unit 26 at a fixed position and issuing a signal indicating that the photoelectric transformation unit 26 has arrived at such position to the controller 28.

In the case in which the photoelectric transformation unit 26 is disposed in front of the diaphragm 24, the photoelectric transformation unit 26 senses the distribution of the respective orders of the light diffracted through the reticle and the energy levels of these orders of the light just before the light reaches the diaphragm 24. Such information is then provided by the photoelectric transformation device 26 to the controller 28. The controller 28 simultaneously receives information regarding the state of the diaphragm 24 from the opening/closing sensor 32. The controller 28 calculates the energy levels of the orders of light that will pass through the aperture (h) of the diaphragm 24, based in part on the signals issued to the controller 28 by the photoelectric transformation unit 26 and sensor 32. The energy levels are those that pertain to the ability of the light to chemically sensitize the photosensitive film (R). Then the controller 28 decides a control standard for the degree to which the diaphragm 24 should be open, i.e., calculates a standard size for the aperture of the diaphragm 24 that will allow an optimum range of the diffracted light to pass therethrough. A drive unit 64 controls (opens/closes) the diaphragm 24 in response to a control signal from the controller 28.

That is, the calculations made by the controller 28 are used to establish a standard for the diaphragm 24 which, when implemented, will produce a desired profile for the sidewall of the photosensitive film (R). The sensor 32 can be used to sense the center of the aperture (h) of the diaphragm 24 or a specific portion thereof, and thereby provide feedback indicative of whether the opening of the diaphragm 24 has been set to the standard.

Meanwhile, a similar operation can be carried out in the case in which the photoelectric transformation unit is disposed proximate to and opposite the rear of the diaphragm 24 by the drive mechanism 30. In this case, the respective orders of the light diffracted through the reticle 20 illuminate a wide region of the diaphragm 24. Accordingly, a portion of the diffracted light passes through the aperture (h) of the diaphragm 24 and the remainder of the light is blocked by the diaphragm 24. At this time, the photoelectric transformation unit 26 senses the distribution of the respective orders of the diffracted light that have passed through the diaphragm 24 and the energy levels of these orders of the diffracted light. The controller 28 calculates the energy level that is obtained through the constructive interference of these orders of the diffracted light from the signals provided by the photoelectric transformation part unit 26, and computes the chemical change that will occur on the photosensitive film (R) due to the constructive interference. This information is then used to obtain the light energy level capable of forming the desired profile of the sidewall of the photosensitive film (R), namely, to obtain the standard size of the aperture of the diaphragm 24.

In the former case (photoelectric transformation unit provided in front of the diaphragm 24), the incident illumination is sensed over a comparatively wide region, whereby the standard opening of the diaphragm 24 can be calculated easily. In the latter case, the energy level of the illumination light that actually passes through the diaphragm 24 is definitely confirmed. Note, also, the opening/closing sensor 32 is used when the photoelectric transformation unit 26 is installed at the front of the diaphragm 24. On the other hand, the photoelectric transformation unit 26 can be used to determine the current degree to which the diaphragm 24 is open when it is located to the rear of the diaphragm 24.

In one embodiment of the photoelectric transformation unit 26, as shown in FIG. 10, the plurality of PIDs are arrayed in two dimensions to form a photoelectric transformation substrate 36a. A support block 38a supports a rear surface or the outer edge of the photoelectric transformation substrate 36a and is, in turn, connected to and supported by a rotary drive mechanism 30a. The PTD arranging sensor 34 is used for centering the photoelectric transformation unit on the optical axis of the projection optics 22 and which axis passes through the center of the aperture (h) of the diaphragm 24.

The rotary drive mechanism 30a supports one side of the photoelectric transformation unit 26, namely, one side of the support block 38a. The rotary drive mechanism 36 is operative to rotate the photoelectric transformation substrate 36a between first and second positions at which the photoelectric transformation substrate 36a is face-to-face with and entirely offset from the aperture (h) of the diaphragm 24, respectively.

In another embodiment of the photoelectric transformation unit 26 shown in FIG. 11, the plurality of PTDs are disposed in a line (a one-dimensional array) to thus form a photoelectric transformation substrate 36b. A support block 38b supports the substrate 36b. The support block 38b is supported by and connected to a linear drive mechanism 30b.

The linear drive mechanism drive 30b includes a guide 40 that supports the photoelectric transformation unit 26, namely, the side(s) of the support block 38b such that the unit can be slid therealong. In this embodiment, the guide 40 is in the form of one or more guide rails. The linear drive mechanism 30b also includes a power transfer unit 42 for driving the photoelectric transformation part 26 along the guide 40 so as to scan the aperture (h) of the diaphragm 24. In addition, a position sensor unit 44 may be provided to sense the position of the photoelectric transformation part 26 relative to the guide 40 and to supply signals indicative of this information to the controller 28. Note, this form of the drive mechanism 30b, namely a linear drive mechanism, can also be used to drive the photoelectric transformation part 26 shown in FIG. 10 in place of the rotary drive mechanism 30a.

Figure 12:
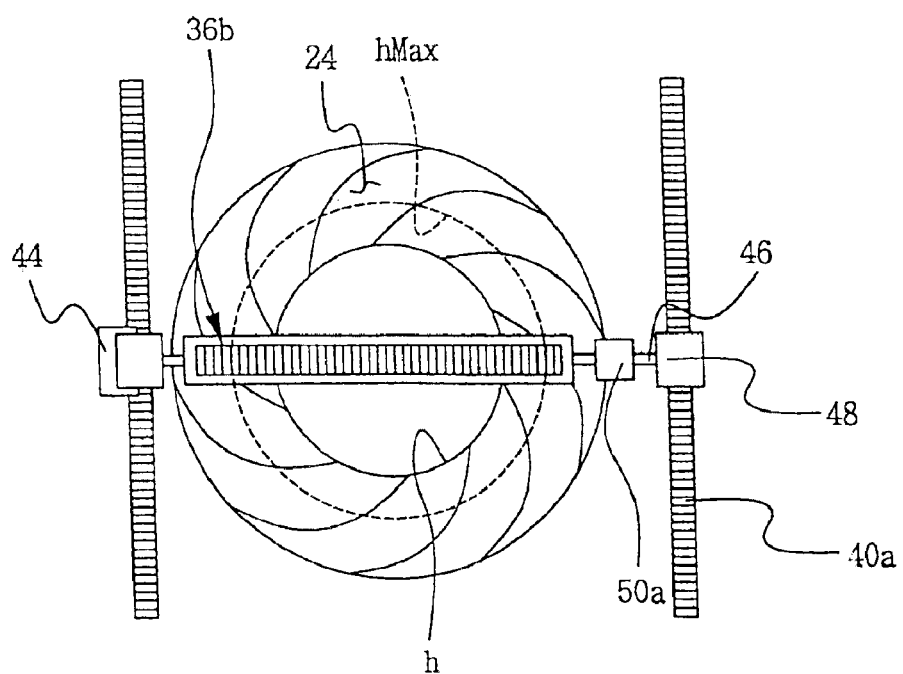
FIGS. 12 through 15 are plan views of respective modified forms of the embodiment of the light energy inspecting apparatus shown in FIG. 11.

In one embodiment of the linear drive mechanism 30b, as shown in FIG. 12, the guide is in the form of a rack 40a. The photoelectric transformation unit 26 supports a shaft 46. A pinion 48 is fixed to the shaft 46 so as to be rotatable about the central axis of the shaft 26 and is meshed with the rack 40a. Also, a motor 50a may be connected to a portion of the shaft 46, to rotate this portion of the shaft 46 in response to a control signal from the controller 28.

Figure 13:
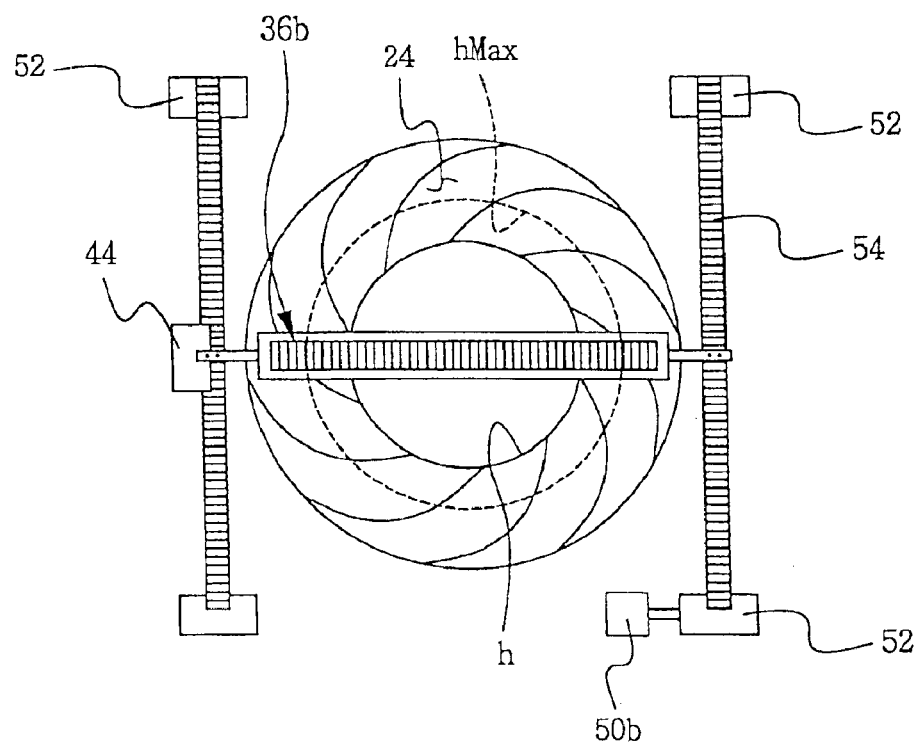

In another embodiment construction of the linear drive mechanism 30b, shown in FIG. 13, the guide is in the form of a belt 54 that is wrapped around a pair of rollers 52. The belt 54 is fixed to a given portion of the photoelectric transformation unit 26. Also, a motor 50b is connected to at least one of the rollers 52 to rotate the rollers 52 and hence, drive the belt 54 to move the photoelectric transformation unit 26 in response to a control signal from the controller 28.

Figure 14:
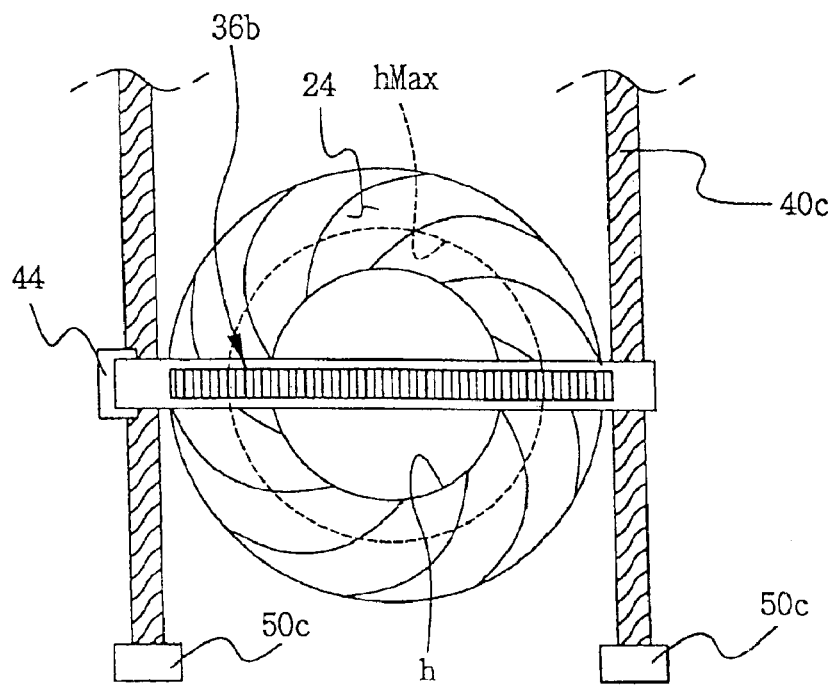

In yet other embodiment of the linear drive mechanism 30b, shown in FIG. 14, the guide is in the form of a rod 40c that has a continuous thread along the length thereof. A nut, fixed to the photoelectric transformation unit 26, is mated with the threaded rod 40c. A motor 50c is also connected to the threaded rod 40c to rotate the threaded rod 40c in response to a control signal from the controller 28.

Figure 15:
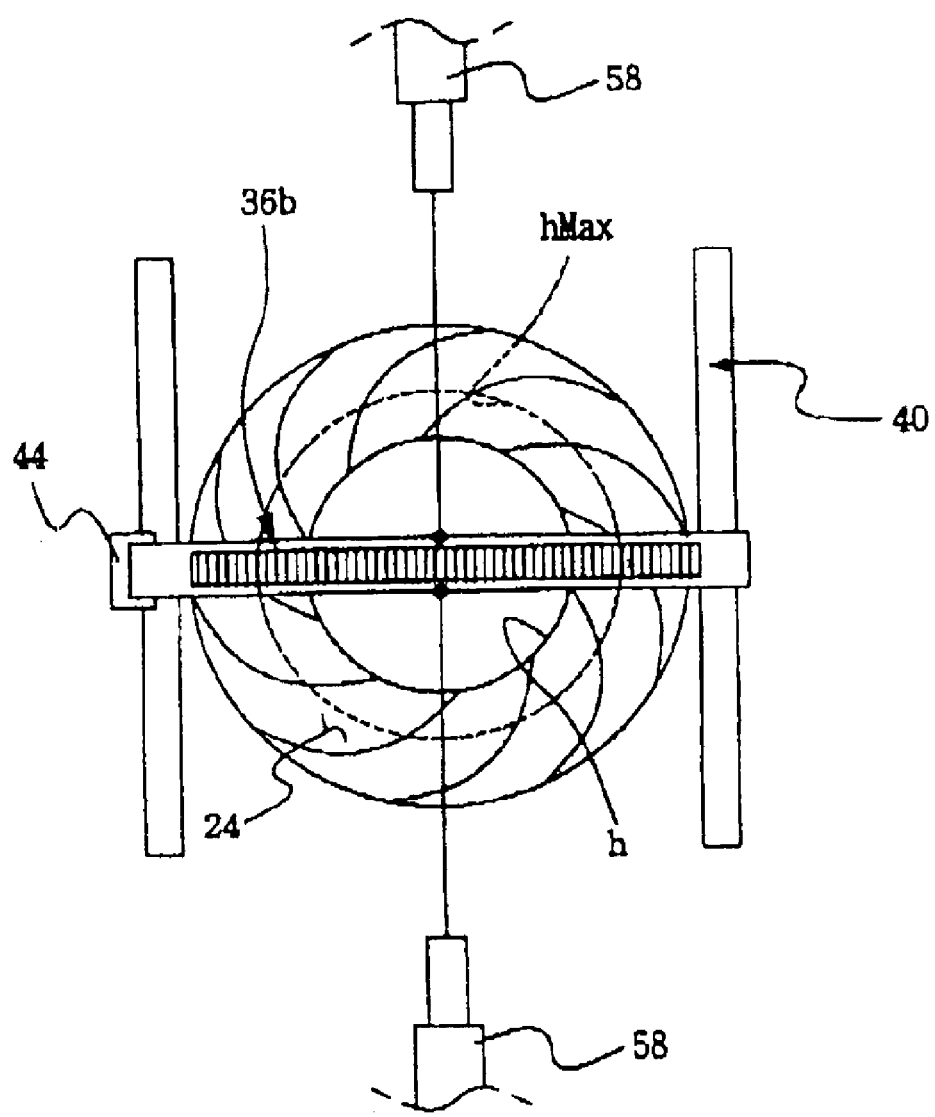

In the embodiment shown in FIG. 15, one or more cylinders 58 is/are used to slide the photoelectric transformation unit 26 along the guide rails in response to a control signal from the controller 28.

Returning now to FIG. 9, a display unit 60 is connected to the controller 28. The display unit 60 displays information pertaining to the light energy inspecting apparatus. For instance, the display unit 60 displays the energy of the light that passes through each of the PTDs of the photoelectric transformation unit 26, the energy of the light that has/will pass through respective portions of the diaphragm 24, and the degree to which the diaphragm 24 is open so that a technician can monitor the exposure conditions.

The steps of establishing the exposure conditions will now be described with reference to FIGS. 1 and 9.

First, the controller 28 controls the drive mechanism 30 so that the photoelectric transformation unit 26 is juxtaposed with the aperture of the diaphragm 24, and before the substrate (W) is placed in the illumination system. Then, light is emitted from the lamp of lamp unit 12. Next, the photoelectric transformation unit 26 senses the energy of respective portions of the light that passes through the aperture of the diaphragm 24, and issues signals to the controller 28. The controller 28 then deduces from this information the energy of the light that will be projected onto the photosensitive film (R) as the result of constructive interference, and estimates the chemical change that will take place at the exposed portion of the photosensitive film (R).

Subsequently, the light condition necessary to form a desired profile for the sidewall of the photosensitive film (R) is determined by the controller 28, and this information is compared with sensed information to arrive at an aperture size for the diaphragm 24, i.e., the size of the aperture that will produce the focus optimum for facilitating the desired patterning of the photosensitive film (R). Next, the control unit 64 is controlled to open/close the diaphragm 24 until the aperture thereof reaches the optimum size determined by the controller 28. The movement of the diaphragm 24 to the selected setting is confirmed by the photoelectric transformation unit 26 (or the opening/closing sensor 32 in the case in which the photoelectric transformation unit 26 is in front of the diaphragm 24).

Then, the controller 28 controls the drive mechanism 30 to move the photoelectric transformation unit 26 away from the diaphragm 24. Subsequently, the substrate W having the photosensitive film (R) thereon is aligned with the projection optics 22 in a state in which the exposure light is cut off by the shutter 14. Then, the exposure process is initiated.

Figure 2:
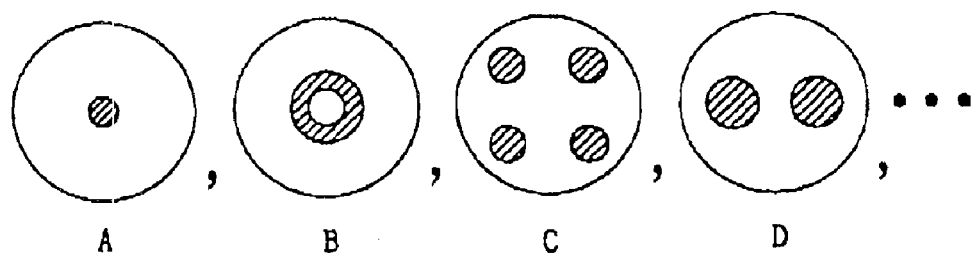
FIG. 2 is an exemplary diagram of light shapes formed by a light source unit of the illumination system shown in FIG. 1.

The above-mentioned steps are executed for each shape of light that is to be provided by the illumination system (for example, any of the shapes shown in FIG. 2). However, the method of the present invention may entail a step of selecting a light shape that is capable of satisfying the optimum light energy and focus conditions based on the selected size of the aperture of the diaphragm 24.

Note, although the present invention was described in detail above in connection with the preferred embodiments thereof, the scope of the invention is not so limited. Rather, various changes to and modifications of the preferred embodiments will become apparent to those of ordinary skill in the art. For instance, although the present invention has been described in connection with sensing the energy and positional information of the 0th and ±1st orders of light, the plurality of PTDs of the photoelectric transformation unit 26 may be arranged to sense only the energy level and positional information of the ±1st order of the diffracted light. Accordingly, these and other changes and modifications are seen to be within the true spirit and scope of the invention as defined by the appended claims.

What is claimed is:

1. An illumination system of apparatus for use in exposing a substrate, the system comprising:

a diaphragm having an adjustable aperture located along an optical axis of the system;

a photoelectric transformation unit having a plurality of photoelectric transformation devices (PTDs) each of which is capable of sensing the energy level of light incident thereon, and the photoelectric transformation unit being operative to output signals indicative of the locations and energy levels of respective portions of light incident on the photoelectric transformation devices thereof:

a drive mechanism connected to and supporting said photoelectric transformation unit and operable to move the photoelectric transformation unit between a first position at which the photoelectric transformation unit is juxtaposed with the aperture of the diaphragm along the optical axis of the illumination system and a second position at which the photoelectric transformation unit is offset from the aperture with respect to the optical axis of the illumination system; and a controller operatively connected to said photoelectric transformation unit and said diaphragm so as to receive the signals output by the photoelectric transformation unit and set the size of the aperture of the diaphragm based on said signals.

2. The illumination system of claim 1, wherein said first position is one at which the photoelectric transformation part is disposed face-to-face with said diaphragm at the upstream side thereof with respect to the direction in which light travels along the optical axis in the illumination system, and further comprising an opening/closing sensor operative to sense the degree to which the diaphragm is open, said opening/closing sensor being operatively connected to said controller so as to provide said controller with information indicative of the degree to which the diaphragm is open.

3. The illumination system of claim 2, and further comprising a PTD arranging sensor operative to sense the presence of said photoelectric transformation unit at said first position, said PTD arranging sensor being operatively connected to said controller so as to provide said controller with information indicative of the photoelectric transformation unit being present at said first position.

4. The illumination system of claim 1, wherein said first position is one at which the photoelectric transformation unit is disposed face-to-face with said diaphragm at the downstream side thereof with respect to the direction in which light travels along the optical axis in the illumination system.

5. The illumination system of claim 1, wherein the photoelectric transformation unit comprises a photoelectric transformation substrate on which the plurality of PTDs are disposed in an array having a dimension, in at least one direction, that is greater than the maximum diameter of the aperture of said diaphragm, and a support block connected to said drive mechanism and supporting said photoelectric transformation substrate.

6. The illumination system of claim 5, wherein said drive mechanism is a rotary drive mechanism that supports one side of said support block and rotates said photoelectric transformation unit between said first and second positions.

7. The illumination system of claim 5, wherein said drive mechanism is a linear drive mechanism comprising a longitudinally extending guide that supports at least one side of said support block, and a power transfer unit that moves said support block in the longitudinal direction of said guide.

8. The illumination system of claim 1, wherein the photoelectric transformation part comprises a photoelectric transformation substrate in which the plurality of PTDs are disposed in a line having a length greater than the maximum diameter of the aperture of said diaphragm, and a support block connected to the said drive mechanism and supporting the photoelectric transformation substrate.

9. The illumination system of claim 8, wherein said drive mechanism is a linear drive mechanism comprising a longitudinally extending guide that supports at least one side of said support block for sliding movement therealong, a power transfer unit that drives said support block in the longitudinal direction of said guide, and a position sensor unit including a sensor operative to sense the relative position of said photoelectric transformation substrate in said longitudinal direction.

10. The illumination system of claim 9, wherein said guide is a rack, said linear dive mechanism further comprises a shaft having a central longitudinal axis connected to and extending from the support block parallel to the line of PTDs, and a pinion meshing with said rack and supported by said shaft so as to be rotatable about the central longitudinal axis thereof and said power transfer unit comprises a motor connected to said pinion so as to rotate said pinion about the central longitudinal axis of said shaft.

11. The illumination system of claim 9, wherein said linear drive mechanism comprises a pair of rollers, said guide is a belt that is to fix said support block and is wrapped around said rollers, and said power transfer Unit is a motor connected to at least one of said rollers.

12. The illumination system of claim 9, wherein said guide comprises a rod having a screw thread extending along the length thereof, said linear drive mechanism also includes a nut integral with said support block and mated with the screw thread of said rod, and said power transfer unit is a motor that rotates said rod relative to said nut.

13. The illumination system of claim 1, and further comprising a display connected to said controller so as to display information received from said controller.

14. A method in of establishing an exposure condition in an illumination system for use in exposing a photosensitive film disposed on a substrate, the illumination system including a light source that emits light, optics that project the light along an optical axis, a reticle disposed along the optical axis and having a pattern that diffracts the light, whereby respective orders of the diffracted light undergo constructive interference, and a diaphragm disposed downstream of the reticle with respect to the optical axis and having an adjustable aperture disposed along the optical axis such that orders of the diffracted light pass through the aperture in amounts corresponding to the diameter of the opening of the aperture, said method comprising:

sensing the levels of energy of respective portions of the diffracted light at a location adjacent said diaphragm and producing information correlating said levels to the locations of said portions of light relative to the diaphragm by a photoelectric transformation unit having a plurality of photoelectric transformation devices (PTDs), wherein the photoelectric transformation unit is operable to move between a first position at which the photoelectric transformation unit is juxtaposed with the aperture of the diaphragm along the optical axis of the illumination system and a second position at which the photoelectric transformation unit is offset from the aperture with respect to the optical axis of the illumination system;

on the basis of said information, calculating the energy level of light produced as the result of the constructive interference of those portions of the diffracted light which pass through the aperture of said diaphragm;

on the basis of the calculated energy level, determining a standard size for the aperture of said diaphragm, that will facilitate a desired focus condition of the diffracted light which passes through the aperture of said diaphragm; and subsequently adjusting the diaphragm until the diameter of the aperture of the diaphragm is of said standard size.

15. The method of claim 14, wherein said sensing of the levels of energy comprises juxtaposing a two-dimensional array of photoelectric transformation devices with the aperture of said diaphragm.

16. The method of claim 14, wherein said sensing of the levels of energy comprises scanning a line of photoelectric transformation devices across the aperture of said diaphragm.

17. The method of claim 14, and further comprising selecting the shape in which the light should be projected, on the basis of the calculated energy level, from among a plurality of different shapes in which the light can be projected by the illumination system.

18. The method of claim 14, and further comprising sensing the size of the opening of the aperture to produce feedback indicative of whether the aperture is of said standard size.

19. A method of exposing a photosensitive film using an illumination system that includes a light source, optics that project the light emitted by the light source along an optical axis, a reticle disposed along the optical axis and having a pattern that diffracts the light, whereby respective orders of the diffracted light undergo constructive interference, and a diaphragm disposed downstream of the reticle with respect to the optical axis and having an adjustable aperture disposed along the optical axis such that orders of the diffracted light pass through the aperture in amounts corresponding to the diameter of the opening of the aperture, said method comprising:

sensing the levels of energy of respective portions of the diffracted light at a location adjacent said diaphragm and producing information correlating said levels to the locations of said portions of light relative to the diaphragm by a photoelectric transformation unit having a plurality of photoelectric transformation devices (PTDs), wherein the photoelectric transformation unit is operable to move between a first position at which the photoelectric transformation unit is juxtaposed with the aperture of the diaphragm along the optical axis of the illumination system and a second position at which the photoelectric transformation unit is offset from the aperture with respect to the optical axis of the illuminations stem;

on the basis of said information, calculating the energy level of light produced as the result of the constructive interference of those portions of the diffracted light which pass through the aperture of said diaphragm;

on the basis of the calculated energy level, determining a standard size for the aperture of said diaphragm that will facilitate a desired focus condition of the diffracted light which passes through the aperture of said diaphragm;

subsequently adjusting the diaphragm until the diameter of the aperture of the diaphragm is of said standard size; and after the diaphragm has been adjusted so that the diameter of the aperture of the diaphragm is of said standard size, aligning a substrate covered with the photosensitive film with the diaphragm and exposing the photosensitive film to light from the illumination system via the aperture of said standard size.

* * * * *